United States Patent [19]
Goldstein et al.

[11] Patent Number: 6,046,065
[45] Date of Patent: Apr. 4, 2000

[54] PROCESS FOR FABRICATING A SEMICONDUCTOR OPTO-ELECTRONIC COMPONENT AND COMPONENT AND MATRIX OF COMPONENTS FABRICATED BY THIS PROCESS

[75] Inventors: Léon Goldstein, Chaville; François Brillouet, Clamart; Cathrine Fortin, Marcoussis; Joël Jacquet, Limours; Paul Salet, Clamart; Jean Luc Lafragette, Marolles En Hurepoix; Antonina Plais, Paris, all of France

[73] Assignee: Alcatel, Paris, France

[21] Appl. No.: 08/928,647

[22] Filed: Sep. 12, 1997

[30] Foreign Application Priority Data

Sep. 13, 1996 [FR] France .................................. 96 11198
Mar. 20, 1997 [FR] France .................................. 97 03413

[51] Int. Cl.[7] .................................................. H01L 21/02
[52] U.S. Cl. .............................. 438/46; 438/47; 438/29; 372/43; 372/44
[58] Field of Search ................................ 438/22, 32, 34, 438/39, 42, 43, 46, 47; 117/954, 953; 257/9, 11, 12; 372/43, 44, 45

[56] References Cited

U.S. PATENT DOCUMENTS 5,502,316  3/1996  Kish et al. .
5,724,376  3/1998  Kish et al. .

FOREIGN PATENT DOCUMENTS 2 694 988  2/1994  France .

OTHER PUBLICATIONS

Patent Abstracts of Japan, vol. 018, No. 080 (E–1505), Feb. 9, 1994 corresponding to JP 05 291698 A (NEC Corp) dated Nov. 5, 1993.

D. I. Babic et al, "Room–Temperature Continuous–Wave Operation of 1.54–Mu M Vertical–Cavity Lasers", *IEEE Photonics Technology Letters*, vol. 7, No. 11, Nov. 1, 1995, pp. 1225–1227.

Patent Abstracts of Japan, vol. 013, No. 461 (C–645), Oct. 18, 1989 corresponding to JP 01 179797 A, JP 0 179798 A (NEC Corp) dated Jul. 17, 1989.

*Primary Examiner*—Charles Bowers
*Assistant Examiner*—Keith Christianson
*Attorney, Agent, or Firm*—Sughrue, Mion, Zinn, Macpeak & Seas, PLLC

[57] ABSTRACT

An epitaxial deposition process is used to deposit materials that can be crystallized lattice matched to gallium arsenide onto an indium phosphide crystalline wafer. A material of this kind forms a metamorphic layer. Metamorphic layers of this kind constitute two semiconductor Bragg mirrors to form resonant cavities of surface emitting lasers of a matrix. This matrix is consolidated by a silicon support. Applications include optical telecommunications.

22 Claims, 5 Drawing Sheets

PROCESS FOR FABRICATING A SEMICONDUCTOR OPTO-ELECTRONIC COMPONENT AND COMPONENT AND MATRIX OF COMPONENTS FABRICATED BY THIS PROCESS

BACKGROUND OF THE INVENTION

1. Field of the Invention

The present invention concerns the fabrication of opto-electronic components such as vertical cavity surface emitting laser (VCSEL) type semiconductor lasers. Other components to which this invention relates are microcavity light-emitting diodes and electrically tunable optical filters. This invention is more particularly concerned with the fabrication of such components when the light emitted or filtered must have a wavelength of about 1.3 $\mu$m or 1.5 $\mu$m so that it is in one of the spectral windows routinely used in fiber optic communication systems. The operation of the component at one of these wavelengths is obtained with the aid of an active structure that is the seat of the specific opto-electronic interaction of the component and which is formed within a monocrystalline indium phosphide (InP) wafer. This material has a cubic crystal lattice.

However, some parts of a laser or other component of this kind are advantageously made of gallium arsenide and/or other materials that also have a cubic crystal lattice but lattice matched to gallium arsenide, the lattice constant of which is different from that of indium phosphide. This applies in particular to a Bragg mirror constituting one end of the optical cavity of a laser or a microcavity light-emitting diode. It also applies to an electrical confinement layer for confining or equalizing the density of the excitation current that injects charge carriers into the optically active layer included in the cavity. A problem of crystal compatibility then arises because good crystal quality appears to be essential to correct operation of the laser, both with regard to a semiconductor wafer that is to constitute the active structure of a laser and with regard to other components such as a semiconductor Bragg mirror. The difficult problem is that of achieving a suitable connection of the crystal lattice of the gallium arsenide to that of the indium phosphide, suitable in the sense that it must be compatible with the required correct operation.

Various processes have been proposed or used to manufacture a surface emitting laser emitting at the wavelengths referred to above but circumventing or solving the problem referred to above.

2. Description of the Prior Art

A first prior art process avoids this problem, at least insofar as the Bragg mirror of the laser is concerned, by constructing this mirror from alternate layers of indium phosphide and a GaInAsP quaternary material lattice matched to the indium phosphide. The small difference between the refractive indices of the two materials then necessitates the formation of a large number of pairs of layers, given the high reflectance that is necessary. This number is in excess of 40 and leads to a narrow optical band of the mirror and a high electrical resistance. The latter is problematical if the excitation current is injected through the mirror. The quaternary material also introduces a resistance impeding the evacuation of heat. This first prior art process is described in "High reflectivity semiconductor mirrors for 1.3 $\mu$m emitting lasers", P. Salet, C. Starck, A. Pinquier, Cleo 96.

The same problem is avoided by lattice matching in a second prior art process in which the materials of the Bragg mirror are AlInAs and GaAlInAs. The drawbacks of this second prior art process are similar to those of the first.

The same problem is also avoided by lattice matching in a third prior art process in which the materials of the Bragg mirror are AlAsSb and AlGaAsSb. Unfortunately, these materials tend to break down into two separate phases. This third prior art process is described in: "AlAsSb: AlGaAsSb Bragg stacks for 1.55 $\mu$m wavelength grown by MBE", J. C. Harmand, F. Jeannes, G. Le Roux and M. Juhel Elec. Lett. Vol 31, 1995, 1669.

A fourth prior art process solves the problem in question, that is to say the problem that the crystal lattice of the Bragg mirror is lattice matched to gallium arsenide and is joined to an indium phosphide wafer. The materials of this mirror are aluminum arsenide AlAs and gallium arsenide. They produce a high reflectance and low thermal and electrical resistances. The mirror is formed by a process of epitaxial deposition on a second wafer of gallium arsenide. This second wafer is welded to the first by pressing them together at 600° C. in an atmosphere of hydrogen, the combination of the two wafers when bonded in this way being referred to as a "composite wafer".

This fourth prior art process is costly because the dimensions of the wafers that can be welded in this way are limited. Lasers are conventionally fabricated economically by making large wafers which can subsequently be cut up so that each of the separated parts constitutes a laser or one or more laser matrices. Because of their limited dimensions, the composite wafers formed by this fourth prior art method cannot each constitute a sufficiently large number of lasers for the method to be economic. Moreover, the threshold voltage of the fabricated lasers is relatively high. This fourth process is known internationally as the "wafer fusion" process and in France as "fusion bonding". It is described in an article by D. I. Babic, K. Treubel, R. P. Mirin, N. M. Margalit, J. E. Bowers, E. L. Hu, D. E. Mars, L. Yang and K. Carey, Photon. Techn. lett. vol 7, 1225, 1995.

One aim of the present invention is to enable the manufacture at low cost of surface emitting lasers or microcavity light-emitting diodes emitting at the wavelengths associated with indium phosphide but incorporating a Bragg mirror or other component having inherent qualities associated with gallium arsenide and with lattice matched materials in a way that prevents bonding two crystal lattices with different lattice constants compromising the performance of the lasers or the diodes. A more general aim of the present invention is to provide a simple and effective way of associating these two types of materials for the manufacture of a component of this kind.

SUMMARY OF THE INVENTION

To this end, the present invention consists of a process for fabricating semiconductor opto-electronic components including at least an operation of metamorphic deposition using an epitaxial deposition process to deposit at least one material that can be crystallized lattice matched to gallium arsenide onto a crystalline wafer lattice matched to indium phosphide so that said material forms at least one metamorphic layer disposed in series with said wafer on a functional optical path of said component.

Other aims of the present invention are indicated below.

Various useful arrangements associated with the present invention are explained hereinafter with the aid of the accompanying diagrammatic drawings and various embodiments of the invention are described by way of example. The figures of the drawings are sectional views of various surface emitting lasers at various stages in their fabrication. If two components of the same kind are shown in two of these figures and have equivalent functions in both lasers they may be designated by the same reference numbers and/or letters.

DETAILED DESCRIPTION OF THE PREFERRED EMBODIMENTS

Figure 1:
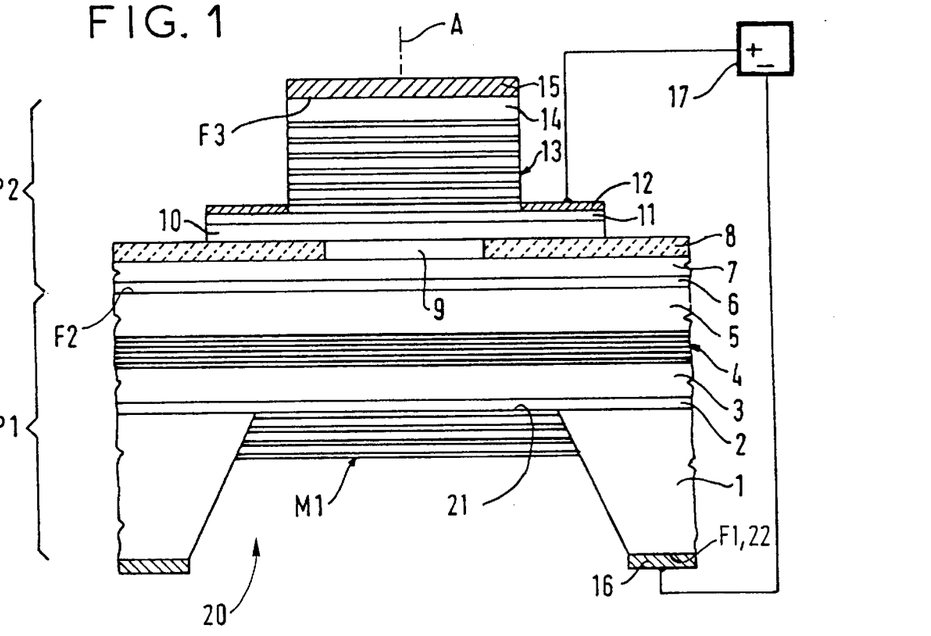
FIG. 1 shows first and second lasers fabricated by respective variants of a first process in accordance with the invention.
Figure 2:
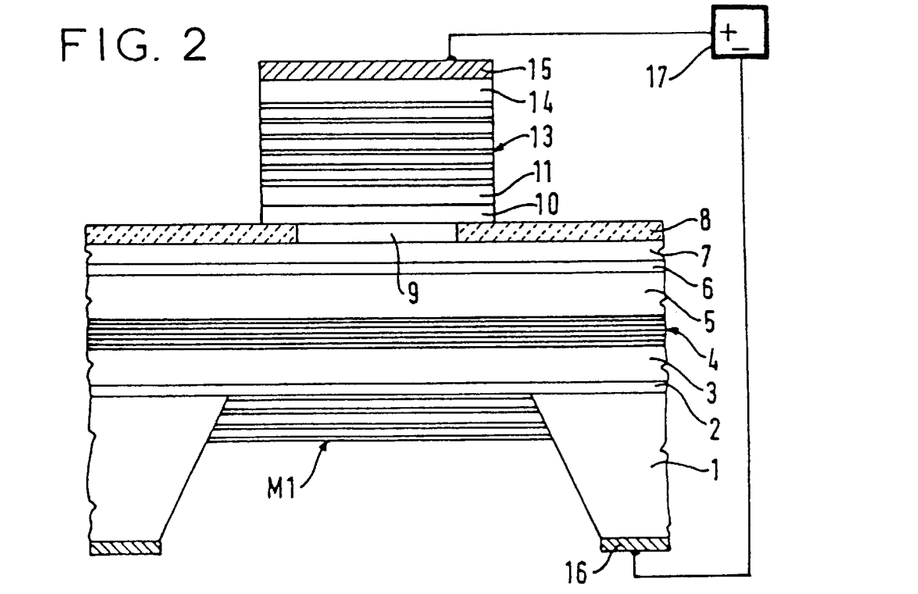
FIG. 2 shows third and fourth lasers fabricated by two other variants of said first process of the invention.
Figure 3:
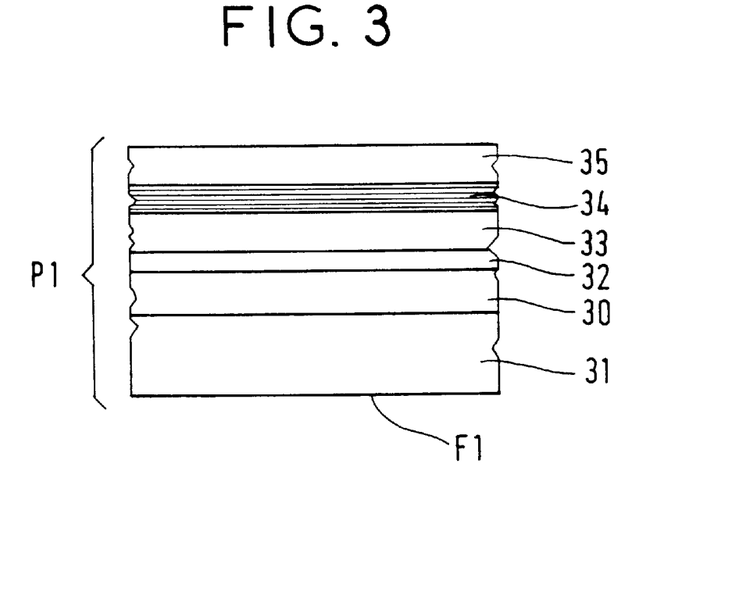
FIGS. 3 to 9 show successive steps in the fabrication of a matrix of lasers by a second process in accordance with the invention, this matrix including a fifth laser.
Figure 4:
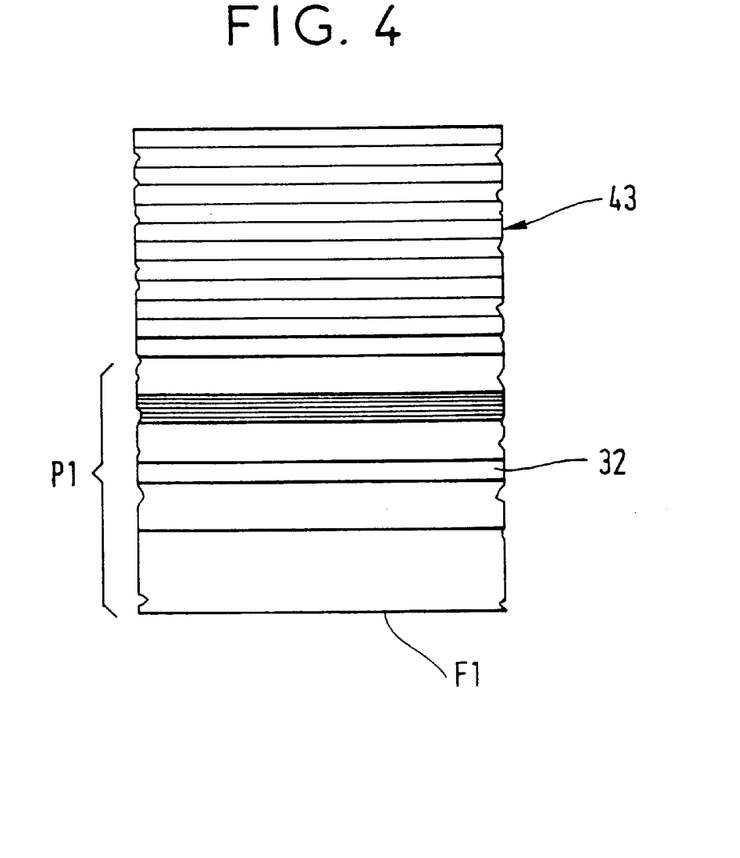
Figure 5:
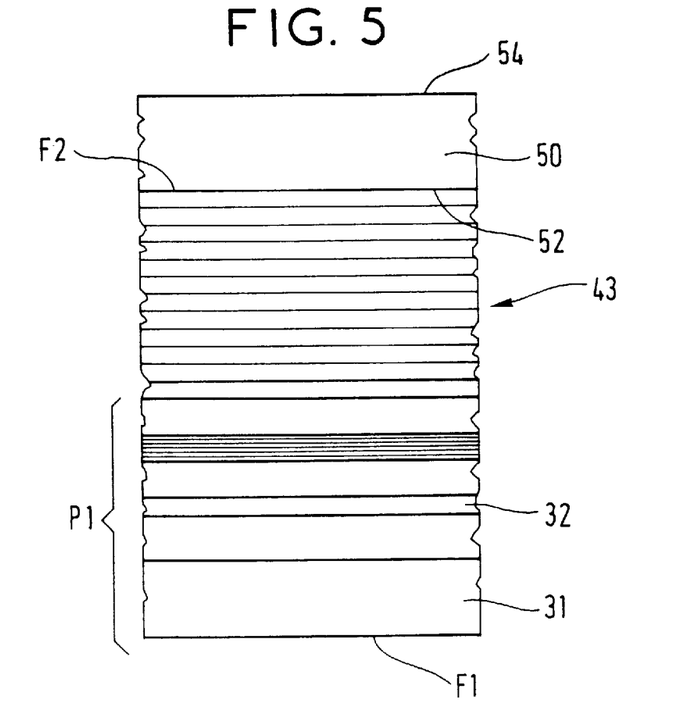
Figure 6:
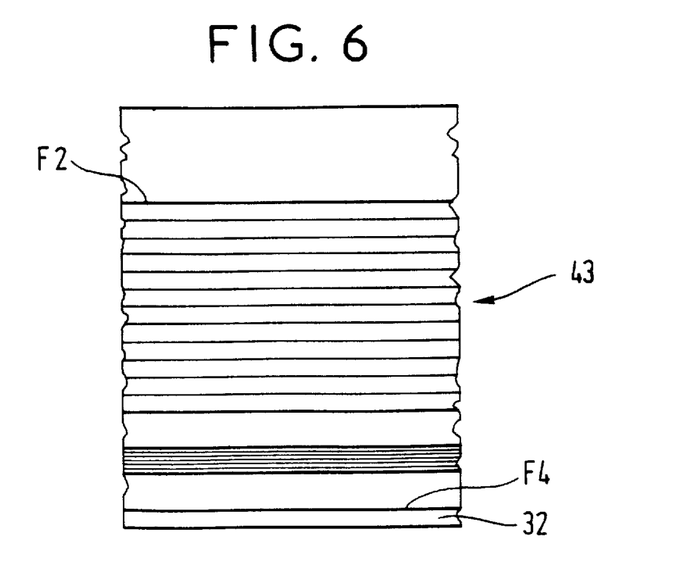
Figure 7:
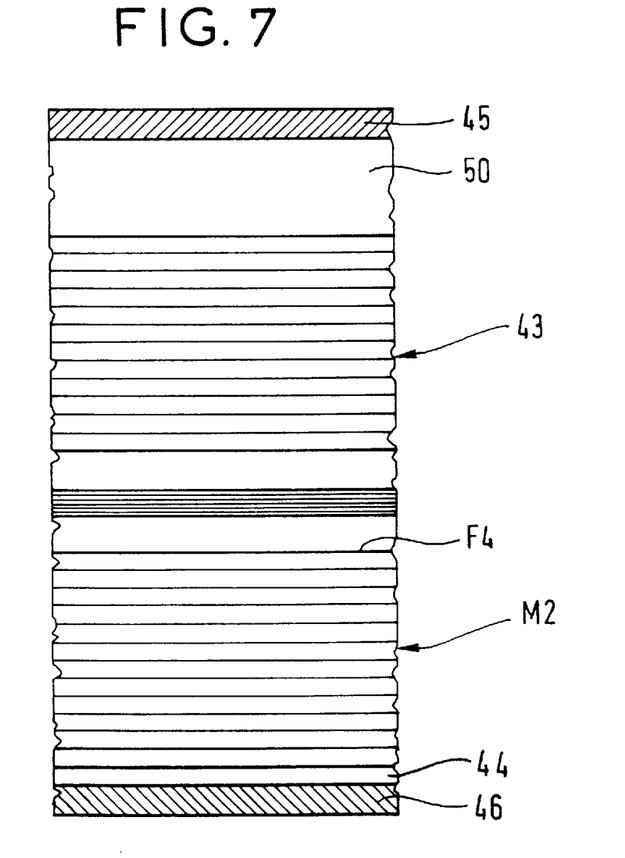

The order of succession of the semiconductor layers shown in FIGS. 1 and 2 from the bottom upwards represents the order of succession of the steps of depositing these layers and the lasers shown are part of a matrix of such lasers.

The surfaces of the semiconductor wafers are deemed to be horizontal and the thickness of these wafers and of the layers deposited on them are deemed to be vertical in the following description. The fabricated components can of course be disposed in any orientation.

Like the fourth prior art process previously mentioned, said first process in accordance with the invention includes the following operations, the layers deposited by these operations being shown in FIG. 1:

Forming said wafer based on indium phosphide InP. In describing this first process, this wafer is sometimes referred to hereinafter as the "first wafer". It has two horizontal principal faces, constituting a bottom face F1 and a top face F2. The active structure included in this wafer includes, from the bottom upwards:

a bottom injection layer 3 having a first type of conductivity, which is typically n type conductivity in this first process of the invention, an active layer 4 consisting of an active material having a ternary or quaternary composition or consisting of quantum wells and lattice matched to indium phosphide, and a top injection layer 5 having the other type of conductivity, i.e. typically p type conductivity.

This structure is adapted to have an excitation current passed through it in a vertical forward direction defined by the conductivity types of the injection layers. It is then able to amplify light at a wavelength between 1 200 nm and 2 000 nm, typically close to 1 300 nm or 1 500 nm.

Placing a second semiconductor wafer P2 made of materials lattice matched to gallium arsenide GaAs on the top face of the first wafer. The superposition of the two wafers forms a composite wafer having a bottom face F1 and a top face F3. Elements associated with the second wafer can have various functions within the laser to be fabricated. Two such functions are indicated below.

Forming a bottom mirror M1 on the bottom face and of a top mirror 13 on the top face of the composite wafer to constitute a vertical resonant optical cavity for the laser to be fabricated. One of these mirrors is partially transparent to enable the light from this laser to escape from this cavity.

Finally, forming a bottom electrode 16 and a top electrode 12 on the bottom and top faces, respectively, of the composite wafer to enable injection of said excitation current through the active structure.

In accordance with the invention, the placing of the second wafer is replaced by a deposition operation effected by said epitaxial deposition process. This operation progressively grows metamorphic layers on the top face of the first wafer.

As is well known, the usual consequence of using the epitaxial deposition process is to form layers having a crystal lattice continuous with the substrate on which the deposition is effected. However, in the context of the present invention, and given the large lattice mismatch between gallium arsenide and indium phosphide, the use of this process causes mechanical strains and dislocations in the crystal lattices of the materials in contact. There are a very large number of dislocations within the thickness of the deposited layers. Thus these layers of this material can be qualified as "metamorphic". Compared to other crystallized materials of the same composition, they can have a relatively high density of dislocations and a relative uniform distribution of these dislocations near the wafer on which they are deposited. Moreover, the strains applied to the crystal lattice of the first wafer can cause dislocations in it. The formation of major dislocations in the active structure contained in this first wafer will prevent operation of the laser. This is perhaps one reason why the fourth prior art manufacturing process previously mentioned includes complex steps so that it is not necessary to use an epitaxial deposition process to form the second wafer. However, in the context of the present invention, it is envisaged that the strains induced in the crystal lattice of the first wafer by a deposition process of this kind are perhaps limited to a small depth from the top face of the wafer, and it has been found that the operation of the underlying active structure may not be significantly affected by dislocations brought about by such strains.

It has also been found that some arrangements make a useful contribution to preserving the functional integrity of the active structure, although they are not indispensable. In accordance with one of these arrangements, the metamorphic deposition operation is preceded by the deposition of a blocking layer 6 lattice matched to indium phosphide. This blocking layer is of a quaternary composition material. It effectively blocks the dislocations generated in the gallium arsenide. It has the following composition, for example: $Ga_{0.2}In_{0.8}As_{0.44}P_{0.56}$.

The epitaxial deposition process used is molecular beam epitaxy, for example. The MOVPE vapor phase growth technique could also be used, however.

The metamorphic deposition operation appears to be effected with great advantage at a temperature below 500° C., for example at 450° or 400° C.

In another arrangement that additionally has other advantages, the top mirror 13 is a Bragg mirror. It is made up of an alternating vertical succession of layers consisting of or based on gallium arsenide GaAs and layers of an index contrast material having a refractive index significantly different from that of gallium arsenide but lattice matched to gallium arsenide. This index contrast material is typically based on aluminum arsenide AlAs. It has the following composition, for example: $Al_{0.9}GA_{0.1}As$. In a manner that is known in itself, a mirror of this kind can produce a very high reflectance, around 99.8%, at least, which is necessary for the laser to operate and would not be possible with a metallic mirror. In the context of the present invention, it has surprisingly become apparent that the fact that a semiconductor Bragg mirror is made up of metamorphic layers does not significantly reduce its qualities and in particular does not introduce light losses likely to impede the operation of a laser. The bottom mirror is then only slightly transparent. It is of the multi-dielectric type for example. Its reflectance is around 99.7%, for example. It is formed by the following operations:

Locally etching the substrate 1 from the bottom face F1 of the wafer P1 to form a recess 20. This recess has a bottom 21. It is sufficiently deep for a reduced thickness of the wafer P1 between this bottom and the top face of the wafer to be equal to the thickness required for the resonant cavity. This thickness is that in the direction of axis A of the cavity. The surface dimensions of the recess are limited so that the surface 22 of the wafer outside the recess is sufficiently large to preserve the manipulation strength of the wafer.

Then, depositing successive layers of dielectric materials onto the bottom 21 of the recess 20, these layers having alternating refractive indices.

The fact that the top wafer is made by superposing many semiconductor layers would seem beneficial to preservation of the functional integrity of the active layer. However, it has been found that depositing the semiconductor layers with a lattice mismatch can cause surface roughness in the interfaces between layers having different refractive indices. Such roughness can lead to light losses through diffraction and such losses could prevent optical oscillation from being established in the resonant cavity. It has nevertheless been found that, using the invention, the roughness can be limited sufficiently for the presence of such layers in the resonant optical cavity of the laser to be compatible with correct operation of the latter.

In accordance with an arrangement that is beneficial for limiting such roughness, the semiconductor layers 7, 9, 10, 13, 14 superposed within the second wafer P2 contain between 0.1 mole percent and 5 mole percent of indium, preferably between 0.5 mole percent and 1 mole percent, for example around 1 mole percent. Adding indium forms "smooth" layers with no roughness.

Where the electrodes are concerned, at least one of them must be disposed laterally of the optical resonant cavity. This is the electrode on the same principal face as the partially transparent mirror. This electrode would prevent light leaving the cavity if it were disposed on the axis A of the latter. Locating one or both electrodes in this manner tends to cause the excitation current to flow at a distance from the resonant cavity. It is desirable for the excitation current in the active layer to be confined to the vicinity of the axis of the cavity. One way to achieve this known in itself is to incorporate into a semiconductor wafer a layer that is oxidized over part of its surface so that it is electrically insulative except in the vicinity of the optical cavity. However, confinement of the current can also be achieved by disposing the top electrode on top of the top mirror, the horizontal dimensions of which are limited to this end by an etching operation. In this case, the partially oxidized layer typically continues to make a useful contribution to uniformizing the excitation current density. This layer is advantageously of aluminum arsenide AlAs which is lattice matched to gallium arsenide. This is why the deposition operation forming the second semiconductor wafer P2 preferably includes the deposition of a layer of gallium arsenide 9 and the oxidation of this layer in a lateral area 8 away from the axis A of the optical resonant cavity.

Four embodiments of this invention will now be described more specifically.

In FIG. 1 the semiconductor layers have been deposited in the order indicated hereinafter to fabricate a first laser in accordance with the present invention. To form firstly a first wafer P1 the following layers are of indium phosphide InP unless otherwise indicated:

A 0.1 mm thick substrate 1 n-doped at the concentration of $3.10^{18}$ cm$^{-3}$.

An etch stop layer 2 of GaInAsP with a characteristic wavelength of 1 180 nm. This layer is 50 nm thick and n-doped at the concentration of $1.10^{18}$ cm$^{-3}$. During etching of the central part of the bottom face F1 of the wafer P1, this layer limits the depth of etching to form a surface on which a bottom mirror M1 made up of dielectric layers is deposited.

A bottom injection layer 3 with a thickness of 1 000 nm to 2 000 nm, n-doped at the concentration of $1.10^{18}$ cm$^{-3}$.

An active layer 4 comprising a ternary or quaternary material or multiple quantum wells and having a characteristic wavelength of 1 300 nm or 1 500 nm. This layer is 100 nm to 1 000 nm thick and is not doped.

Finally, a top injection layer 5 which is 100 nm to 2 000 nm thick and p-doped at the concentration of $2.10^{18}$ cm$^{-3}$.

A 30 nm thick layer 6 of GaInAsP is deposited on the top face F2 of the wafer P1. This layer is too thin to play any optical role.

The following layers are then deposited to form the second wafer P2, and are of gallium arsenide unless otherwise indicated:

A bottom layer 7 having a thickness of 300 nm to 500 nm and p-doped at the concentration of $2.10^{18}$ cm$^{-3}$. The peripheral area of this layer is oxidized to constitute a dielectric screen 8 of AlOx used to confine or to uniformize the excitation current density.

A contact layer 10 having an optical thickness equal to ¾ the emission wavelength of the laser, p-doped at the concentration of $3.10^{19}$ cm$^{-3}$.

An etch stop layer 11 of indium and gallium phosphide GaInP. The proportions of indium and of gallium in this layer are chosen to lattice match gallium arsenide. This layer is 10 nm to 50 nm thick and is not doped. Its role is to limit the depth of etching of the top face F3 of the composite wafer including the wafers P1 and P2 carried out subsequently to delimit laterally the top mirror 13 of the laser.

The top mirror 13. This mirror comprises 20 to 30 pairs of layers 5 each comprising two undoped layers having the same optical thickness, equal to ¼ the wavelength of the laser. The material of one of the layers of each pair has the composition $Ga_{0.1}Al_{0.9}As$ and is lattice matched to gallium arsenide. The material of the other layer is gallium arsenide.

Finally, an undoped phase matching layer 14 approximately 200 nm thick. The aim of this layer is to introduce an appropriate optical distance between the mirror 13 and a top metallic layer 15 that reflects light and therefore cooperates with the mirror 13.

The combination of the layers 13 and 14 is etched to delimit the top mirror 13 laterally. After this etching a metallic layer of gold Au and/or tungsten W is deposited on the top face F3 of the composite wafer. It constitutes a complementary reflector 15 on the top mirror. On the layer 11 and on the contact layer 10 this metallic layer constitutes a top electrode 12 around the mirror 13.

A bottom electrode 16 is deposited on the bottom face F1 around the bottom mirror M1. The excitation current of the laser is subsequently applied to these electrodes by a power supply 17.

The fabrication of three other lasers which also constitute examples of the invention is similar to what has just been described except in respect of the points indicated hereinafter.

In the second laser shown in FIG. 1 the top mirror 13 is made by depositing dielectric layers with alternating refractive indices.

In the third laser shown in FIG. 2 the mirror 13 is made up of the same pairs of semiconductor layers as in the first laser except that these layers are p-doped to enable injection of the laser excitation current from the complementary reflector 15 which then also constitutes the top electrode 35. The layer 14, which is doped accordingly, has an electrical conduction function similar to that of the contact layer.

In the fourth laser, which is similar to the third, and also shown in FIG. 2, the mirror 13 comprises the same pairs of layers as in the third laser except that these layers are n-doped to reduce the electrical resistance and the optical losses of the mirror. The layers 7, 9 and 11 are also n-doped and the excitation current is transmitted via an n/p tunnel junction formed by the layers 5 and 7.

The second process in accordance with the present invention differs only slightly from the first, in particular in that it achieves not only the aims as previously mentioned but also additional aims such that this second process constitutes a preferred embodiment of the invention. These additional aims are indicated after a further explanation of the problems that arise in the fabrication of components such as surface emitting lasers.

As previously indicated, a Bragg mirror can advantageously be formed on an indium phosphide wafer P1 as previously described by depositing metamorphic layers consisting of materials whose crystal lattice matches that of gallium arsenide, one of these materials typically being gallium arsenide itself. It can therefore be beneficial to construct the bottom mirror from these metamorphic layers, although this is not done in the first process in accordance with the invention. It is well known that the two mirrors constituting the resonant optical cavity of a laser of this kind must be separated by distance that enables correct operation of the laser. The two mirrors must therefore be deposited on the two opposite principal faces of a wafer like the wafer P1 so that they are necessarily separated by the thickness of the latter.

A wafer of this kind has to be manipulated in various ways during the laser fabrication process. To enable economic collective fabrication of a large number of lasers, the wafer must be relatively large. To resist manipulation, a wafer this size must have a relatively great thickness, for example 0.1 mm. This thickness is much greater than the relatively small distance required between the two mirrors of the optical cavity of a laser, for example 0.04 mm. A thickness problem then arises, namely reconciling the relatively great thickness that is needed to enable manipulation of the semiconductor wafer and the relatively small thickness required between the two mirrors forming the optical cavity of each of the lasers to be fabricated.

The processes known in themselves do not constitute a total solution to this problem. In one such process, the mirrors of each optical cavity are Bragg mirrors based on gallium arsenide. Each such mirror must be disposed on one face, for example a top face, of an indium phosphide based wafer. For this it must first be fabricated by epitaxial deposition on a relatively thick gallium arsenide substrate. It is then assembled to the indium phosphide wafer by wafer fusion and reinforces it mechanically so that the opposite face of the wafer, for example its bottom face, can then be etched to thin the wafer. A second operation of the same type deposits the second mirror to form the optical cavity. This first process known in itself is costly because the dimensions of the mirrors and of the wafers that can be assembled in this way are limited, which limits the number of lasers that can be fabricated from the same wafer. Moreover, the crystalline dislocations occurring at the interface between the wafer and the mirrors which are attached to it by wafer fusion and these dislocations are such that they affect the operation of the laser fabricated by this process. Finally, this process requires the use of three semiconductor substrates.

In a second process known in itself that solves this thickness problem a wafer is fabricated by epitaxial deposition of the active structure onto the top face of a relatively thick indium phosphide substrate 1. Localized dielectric layer mirrors are deposited on the top phase of the wafer. Then, as previously described for the fabrication of the first laser shown in FIG. 1, the bottom face of the substrate is locally etched through a mask to form a recess for each chip. Dielectric layer mirrors are then deposited on the bottom of these recesses to include each chip in an optical cavity. This second process known in itself has the following drawbacks:

The semiconductor wafer is made more fragile by the recesses, even if intact areas remain between the recesses.

The process is long and delicate.

The flanks of the recesses are steeply inclined to the vertical direction. The fact that these recesses do not overlap each other results in a large distance between the mirrors deposited on their bottoms. This leads to a large (greater than 0.5 mm) spacing between the lasers and therefore limits the number of lasers that can be fabricated from the same wafer.

Additional aims of the present invention include:

enabling economic and reliable fabrication of optoelectronic components such as surface emitting semiconductor lasers that have to emit at the wavelengths associated with indium phosphide, enabling good electrical isolation between components formed on the same wafer to constitute a laser matrix, and enabling good dissipation of the heat generated in the active structure of a component fabricated in this manner.

FIGS. 3 to 9 show the second process in accordance with the invention, which achieves these additional aims. If elements shown in these figures are similar to elements shown in FIGS. 1 and 2 they can be designated either by the same reference letters and/or numbers or by reference numbers increased by 30, the layer 31 from FIG. 3 being analogous to the layer 1 from FIG. 1, for example. Moreover, in FIGS. 5 to 9 the order of the operations to deposit the new layers shown correspond to the order in which these layers follow on from the top downwards in these Figures.

The steps of the second process in accordance with this invention will first be described generally in a manner that also applies to the first process, and then in a specific manner corresponding only to the second process. It should be understood that to reduce repetition, some non-essential operations are described for only one of the two processes, although they can also be used for the other.

Essential operations common to both processes are:

Forming the wafer P1. This wafer has a thickness between a bottom face F1 and a top face F2. This thickness is sufficient to impart to the wafer sufficient mechanical strength to allow it to be manipulated. This mechanical strength will be referred to hereinafter as "manipulation strength".

Forming at least one top mirror 13 or 43 on the top face of the wafer. This top mirror is a Bragg mirror. It is formed by depositing a vertical succession of metamorphic layers consisting alternately of a material such as gallium arsenide AsGa and an index contrast material as previously described with reference to the first process. These layers constitute top mirror layers.

Forming at least one bottom mirror M1 or M2 on the bottom face of the wafer P1 to constitute a vertical resonant optical cavity for each component to be fabricated. Each such resonant cavity comprises the combination of a bottom mirror and a top mirror facing each other along the axis A of the cavity. At least one of the two mirrors is partly transparent to enable the cavity to be optically coupled to a unit external to the component.

Finally, forming a bottom electrode 16 or 46 and of a top electrode 12, 15 or 45, respectively on the bottom face and the top face of the wafer P1 to enable the application of an electrical control signal across the wafer for each component to be fabricated.

To be more specific, the wafer P1 is formed by epitaxial deposition operations on a substrate 1 or 31 having a first type of conductivity. This first type of conductivity is the n type or the p type according to whether the first or the second process given by way of example is under consideration. These operations include, in succession:

depositing a buffer layer 30 having the first type of conductivity, depositing a doped bottom layer 3 or 33 having the first type of conductivity, depositing an active layer 4 or 34, and depositing a doped top layer 5 or 35 having a second type of conductivity opposite to the first to constitute an active structure. The electrical control signal is typically an excitation current for injecting charge carriers into said active layer from the bottom and top doped layers, said component being a surface emitting laser or a microcavity light-emitting diode. The component could, however, also be an electroabsorption amplitude modulator, a phase modulator or a tunable filter, for example. The active layer would then not have the function of amplification but instead a function of absorbing or phase-shifting light. The emitted light modulated or filtered by said component is referred to as "light from this component" hereinafter. The path followed by this light in this component constitutes the "functional optical path" previously mentioned. This optical path extends along the part of the axis A that is inside the optical cavity.

In accordance with the invention, this process is typically applied to the fabrication of a matrix of components comprising a plurality of opto-electronic components mutually juxtaposed in a surface of the matrix. Some of the operations are collective fabrication operations effected by depositing or eliminating at least one layer extending over all of the surface of the matrix to be fabricated. A layer deposited by a collective fabrication operation of this kind constitutes a collective layer like the layer 46. The wafer P1 is formed by a set of such operations, this set itself constituting one such operation. The process then further includes at least one separation operation. Each such separation operation includes localized etching of a collective layer for mutual isolation of a plurality of areas of the collective layer and assignment of these areas to the respective opto-electronic components to be fabricated.

To be more specific, in the second process of the invention, the operation of forming at least one bottom mirror includes the following collective fabrication operations:

Preparing a support 50 having a bottom face 52 and a top face 54 and a thickness conferring upon it mechanical strength constituting said manipulation strength.

Placing this support on top of said top face F2 of the wafer P1.

Fixing this support to this wafer by wafer fusion. This wafer fusion is effected by pressing the bottom face 52 of this support onto each top mirror 43 at raised temperature.

Etching the wafer P1 from its bottom face F1. This etching eliminates the substrate 31 and then the etch stop layer 32 so that the wafer has the thickness required for the resonant cavity. It replaces the bottom face F1 by a new bottom face F4.

Finally, depositing successive layers onto this new bottom face, these layers constituting collective layers and having alternating refractive indices to constitute each bottom mirror like the mirror M2. This mirror is a Bragg mirror formed by depositing a vertical succession of metamorphic layers constituted as previously indicated. These layers constitute bottom mirror layers.

The operation of forming a bottom electrode 46 includes:

a collective fabrication operation effected by depositing a bottom electrode layer constituting a collective layer, and a separation operation consisting in etching the bottom electrode layer.

The operation of depositing at least one bottom mirror M2 includes:

a collective fabrication operation effected by depositing bottom mirror layers, and a separation operation consisting in etching these bottom mirror layers.

Figure 8:
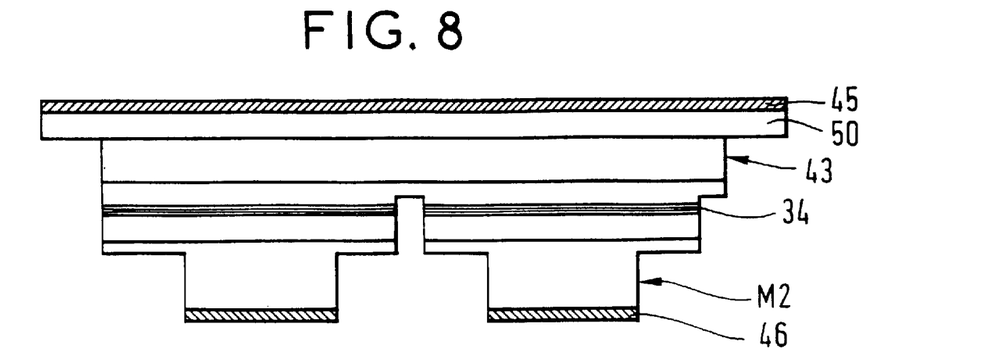
Figure 9:
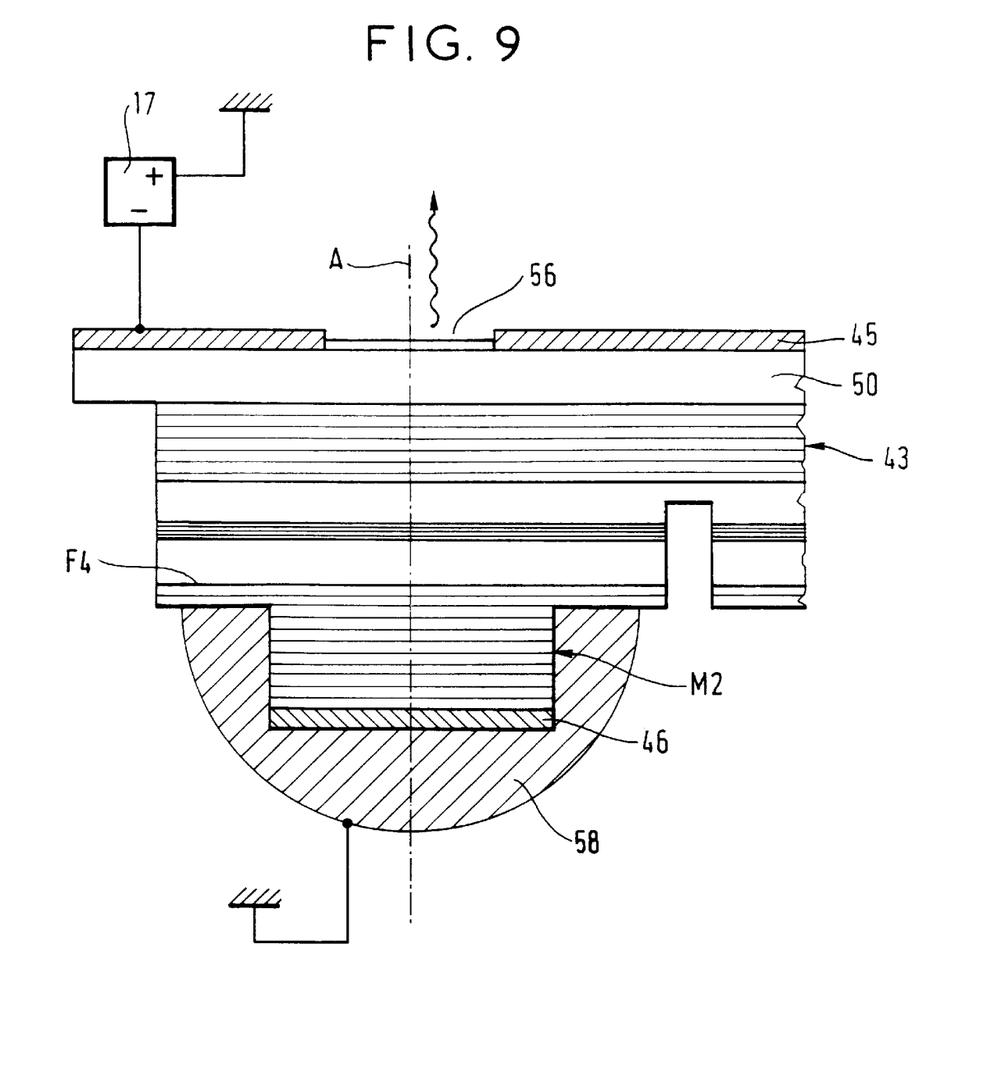

Referring to FIGS. 8 and 9, a complementary separation operation etches the wafer P1 from its bottom face as far as the top injection layer.

The top mirror 43 is preferably partially transparent and preferably has the second type of conductivity, the support 50 is preferably a semiconductor and transparent and preferably also has said second type of conductivity. The operation of forming a top electrode then includes:

a collective deposition operation effected by depositing a top electrode layer 45 onto the top face 54 of the support 50, and an etching operation forming a window 56 for each component to be fabricated in this top electrode layer. This window extends around the axis A of the optical cavity of this component to enable light to exit the component.

The support 50 is preferably of silicon. Other embodiments of the invention are possible, however, in which neither the light nor the energization electrical current of the component needs to pass through this support. This support could then equally well be of some other material such as aluminum nitride.

The process preferably further includes an operation of forming a heatsink 58 for each component to be fabricated. This operation is effected by depositing a mass of material that is a good conductor of heat, such as gold, onto the top face F1 of the wafer, onto the bottom mirror M2 and/or onto the bottom electrode 46 of this component.

This has the advantage that the heatsink is as close as possible to the source of heat, consisting of the active structure of the component. This would not be so if the heat had to pass through the support in order to be evacuated.

The following more specific numerical values and compositions are given by way of example only for implementation of the second process in accordance with the invention. Unless otherwise indicated, the layers of the wafer P1 are of indium phosphide InP.

Substrate 31: thickness 0.25 mm or 0.3 mm, diameter: 50 mm.

Buffer layer 30: thickness 1 000 nm.

Etch top layer 32: GaInAsP quaternary material, characteristic wavelength 1 180 nm, thickness 150 nm.

Bottom injection layer 33: p-doped at the rate of $1.10^{18}$ cm$^{-3}$, thickness 270 nm.

Active layer 34: 7 to 9 quantum wells 10 nm thick with characteristic wavelength 1 550 nm separated by 10 nm thick barriers with characteristic wavelength 1 180 nm.

Top injection layer 35: n-doped at the rate $1.10^{18}$ cm$^{-3}$, thickness 270 nm.

Top mirror 43: 23.5 pairs of layers comprising alternately AlAs and GaAs, thickness about 100 nm, N-doped at the rate of $1.10^{18}$ cm$^{-3}$.

Crystallized silicon support 50: thickness 0.3 mm, diameter 75 mm.

Top mirror 43 and support 50 fusion bonded at 600° C. or 700° C. in a flux of hydrogen at a pressure of 30 g/cm$^2$ to 150 g/cm$^2$ for 20 minutes to one hour.

Bottom mirror M2 deposited by molecular beam epitaxy and differing from the mirror 43 only in its doping type, which is the P type.

Bottom contact layer 44: thickness 100 nm, p-doped at the rate of $3.10^{19}$ cm$^{-3}$.

From the foregoing it is apparent that a matrix of optoelectronic components made by the second process in accordance with the invention includes at least the following:

A crystalline wafer P1 lattice matched to indium phosphide and an inherent mechanical strength lower than the desirable mechanical strength of the matrix.

Metamorphic layers 43, M2 of materials that can be crystallized lattice matched to gallium arsenide. These metamorphic layers are formed on the wafer P1 and are disposed in series with the wafer on a functional optical path A of each component of the matrix.

Finally, a support 50 made from a material different from those of the metamorphic layers and of the wafer P1. This support has a greater mechanical strength than the mechanical strength of the wafer. It is fixed directly to the metamorphic layers 43 by wafer fusion to confer the required mechanical strength on the matrix.

The above description concerns the fabrication of lasers in particular.

The fabrication of a microcavity light-emitting diode essentially differs from that of a laser of the above kind in the length of the cavity between the two mirrors and in the reflectance of these mirrors. The values to be obtained for this length and for these reflectances in the context of the present invention are the same as those well known to the skilled person for such diodes outside the field of the invention.

The fabrication of a tunable filter further differs, in particular, in that the two mirrors must be partly transparent and in that the active structure operates with a different electrical polarization, possibly variable. Once again the values to be obtained for these parameters are well known to the skilled person.

There is claimed:

1. A process for fabricating semiconductor opto-electronic components including at least an operation of metamorphic deposition using an epitaxial deposition process to deposit at least one material that can be crystallized lattice matched to gallium arsenide onto a crystalline wafer lattice matched to indium phosphide so that said material forms at least one metamorphic layer disposed in series with said wafer on a functional optical path of said component, and wherein said wafer lattice matched to indium phosphide includes an active layer of a laser structure and said metamomhic deposition forms semiconductor mirrors of said laser structure.

2. A process for fabricating semiconductor opto-electronic components including at least an operation of metamorphic deposition using an epitaxial deposition process to deposit at least one material that can be crystallized lattice matched to gallium arsenide onto a crystalline wafer lattice matched to indium phosphide so that said material forms at least one metamorphic layer disposed in series with said wafer on a functional optical path of said component, including the operations of:

forming said wafer, said wafer having a thickness between a bottom face and a top face, said thickness being sufficient to confer upon said wafer mechanical strength enabling manipulation of said wafer, said mechanical strength constituting a manipulation strength, forming at least one top mirror on said top face of said wafer, said top mirror being a Bragg mirror and being formed by depositing a vertical succession of said metamorphic layers consisting alternately of a material based on gallium arsenide GaAs and an index contrast material having a refractive index significantly different from that of gallium arsenide but lattice matched to gallium arsenide, said layers constituting top mirror layers, forming at least one bottom mirror on said bottom face of said wafer to constitute a vertical resonant optical cavity having an axis for each component to be fabricated, each resonant cavity comprising the combination of a bottom mirror and a top mirror facing each other along said axis, at least one of said top and bottom mirrors being partly transparent to enable said cavity to be optically coupled to a unit external to said component, and forming a bottom electrode and a top electrode on said bottom face and said top face, respectively, of said wafer to enable application of an electrical control signal across said wafer for each component to be fabricated.

3. The process claimed in claim 2 wherein said metamorphic deposition operation begins with depositing a quaternary composition blocking layer.

4. A process for fabricating semiconductor opto-electronic components including at least an operation of metamorphic deposition using an epitaxial deposition process to deposit at least one material that can be crystallized lattice matched to gallium arsenide onto a crystalline wafer lattice matched to indium phosphide so that said material forms at least one metamorphic layer disposed in series with said wafer on a functional optical path of said component, wherein said epitaxial deposition process is molecular beam epitaxy.

5. The process claimed in claim 2 wherein said metamorphic layers contain between 0.1 mole percent and 5 mole percent of indium.

6. The process claimed in claim 5 wherein said proportion of indium is between 0.5 mole percent and 1 mole percent.

7. The process claimed in claim 2, said wafer being formed by epitaxial deposition operations on a substrate having a first type of conductivity, said operations including in succession:

depositing a doped bottom layer having said first type of conductivity, depositing an active layer, and depositing a doped top layer having a second type of conductivity opposite to said first type to constitute an active structure.

8. The process claimed in claim 7 wherein a metamorphic deposition operation includes depositing a layer of aluminum arsenide and oxidizing said layer in a lateral area away from said axis of said resonant cavity.

9. A process as claimed in claim 7 applied to the fabrication of a matrix of components including a plurality of said opto-electronic components mutually juxtaposed in a surface of said matrix, certain of said operations being collective fabrication operations effected by depositing or eliminating at least one layer extending over all of said surface of said matrix, a layer deposited by a collective fabrication operation constituting a collective layer, said operation of forming said wafer being a collective fabrication operation, said process further including at least one separation operation, each separation operation including localized etching of a collective layer in order mutually to isolate a plurality of areas of said collective layer and to allocate said areas to respective opto-electronic components to be fabricated.

10. The process claimed in claim 9, said operation of forming at least a bottom mirror including the following operations for each resonant cavity:

locally etching said substrate from said bottom face of said wafer to form a recess having a bottom, said recess being sufficiently deep for a reduced thickness of said wafer between said bottom and said top face of said wafer to be equal to a required thickness for said resonant cavity along said axis of said cavity, surface dimensions of said recess being limited so that a surface of said wafer outside said recess is sufficient to preserve said manipulation strength of said wafer, and depositing successive layers onto said bottom of said recess, said layers having alternating refractive indices in order to constitute a bottom mirror.

11. The process claimed in claim 10 wherein said bottom mirror layers are dielectric layers.

12. The method claimed in claim 9, said operation of forming a top electrode including:

a collective fabrication operation effected by depositing a top electrode layer constituting a collective layer, and a separation operation consisting in etching said top electrode layer.

13. The process claimed in claim 12, said operation of depositing at least one top mirror including:

a collective fabrication operation effected by depositing said top mirror layers, and a separation operation consisting in etching said top mirror layers.

14. The process claimed in claim 9 wherein said operation of forming at least one bottom mirror includes collective fabrication operations including:

preparing a support having a bottom face and a top face and having a thickness conferring upon it mechanical strength constituting said manipulation strength, placing said support on top of said top face of said wafer, fixing said support to said wafer by wafer fusion, said wafer fusion being effected by pressing said bottom face of said support onto each top mirror at raised temperature, etching said wafer from said bottom face to confer on said wafer a required thickness for said resonant cavity by replacing said bottom face by a new bottom face, and depositing successive layers on said new bottom face, said layers constituting collective layers and having alternating refractive indices to constitute each bottom mirror.

15. The process claimed in claim 14, said bottom mirror being a Bragg mirror formed by depositing a vertical succession of metamorphic layers based on gallium arsenide AsGa and an index contrast material having a refractive index significantly different from that of gallium arsenide and lattice matched to gallium arsenide, said layers constituting bottom mirror layers.

16. The process claimed in claim 14, said operation of forming a bottom electrode including:

a collective fabrication operation effected by depositing a bottom electrode layer constituting a collective layer, and a separation operation consisting in etching said bottom electrode layer.

17. The process claimed in claim 16, said operation of depositing at least a bottom mirror including:

a collective fabrication operation effected by depositing said bottom mirror layers, and a separation operation consisting in etching said bottom mirror layers.

18. The method claimed in claim 15 wherein said top mirror is partly transparent and has said second type of conductivity, said support being a semiconductor and transparent and also having said second type of conductivity, said operation of forming a top electrode including:

a collective deposition operation effected by depositing a top electrode layer on said top face of said support, and an etching operation forming a window for each component in said top electrode layer, said window extending around said axis of said optical cavity of said component to enable light to exit said component.

19. The process claimed in claim 18 wherein said support is made of silicon.

20. The process claimed in claim 18, further including an operation of forming a heatsink for each component, said operation being effected by depositing a mass of material that is a good conductor of heat onto said bottom face of said wafer, onto said bottom mirror and/or onto said bottom electrode of said component.

21. A semiconductor opto-electronic component including:

a crystalline wafer lattice matched to indium phosphide, where said wafer includes an active layer of a laser structure, and metamorphic layers constituted of materials that can be crystallized lattice matched to gallium arsenide, disposed in series with said wafer on a functional optical path of said component, where said metamorphic layers comprise semiconductor mirrors of said laser structure.

22. A matrix of semiconductor opto-electronic components including:
- a crystalline wafer lattice matched to indium phosphide and having an inherent mechanical strength less than a required mechanical strength of said matrix,
- metamorphic layers constituted of materials that can be crystallized lattice matched to gallium arsenide, said metamorphic layers being formed on said wafer and being disposed in series with said wafer on a functional optical path of each component of said matrix, and
- a support made of a material different from those of said metamorphic layers and said wafer, said support having a mechanical strength greater than said mechanical strength of said wafer and being fixed directly to said metamorphic layers by wafer fusion to confer said required mechanical strength on said matrix.

* * * * *